United States Patent

Lee et al.

[11] Patent Number: 5,827,571
[45] Date of Patent: Oct. 27, 1998

[54] HOT-WALL CVD METHOD FOR FORMING A FERROELECTRIC FILM

[75] Inventors: Seaung Suk Lee; Ho Gi Kim; Jong Choul Kim; Soo Han Choi, all of Bubaleub, Rep. of Korea

[73] Assignee: Hyundai Electronics Industries Co., Ltd., Rep. of Korea

[21] Appl. No.: 932,344

[22] Filed: Sep. 17, 1997

Related U.S. Application Data

[63] Continuation of Ser. No. 476,734, Jun. 7, 1995, abandoned.

[30] Foreign Application Priority Data

Jun. 8, 1994 [KR] Rep. of Korea .................. 1994-12900

[51] Int. Cl.$^6$ ..................................................... C23C 16/40
[52] U.S. Cl. .................................. 427/255.3; 427/255.2; 427/255.1; 427/126.3
[58] Field of Search ............................. 427/255.3, 255.2, 427/255.1, 126.3, 248.1; 118/719, 724

[56] References Cited

U.S. PATENT DOCUMENTS

| | | |
|---|---|---|
| 4,625,678 | 12/1986 | Shioya et al. ............................. 118/723 |
| 4,792,463 | 12/1988 | Okada et al. ......................... 427/126.3 |
| 5,356,477 | 10/1994 | Visser ....................................... 118/726 |
| 5,431,958 | 7/1995 | Desu et al. ............................ 427/255.3 |

OTHER PUBLICATIONS

Si et al, J. Appl. Phys. 73(11), Jun. 1993 pp. 7910–7913.

*Primary Examiner*—Roy V. King
*Attorney, Agent, or Firm*—Merchant, Gould, Smith, Edell, Welter & Schmidt

[57] ABSTRACT

The present invention is to provide a method for forming ferroelectric films using a hot-wall chemical vapor deposition apparatus, comprising the steps of: heating the processing tube and a plurality of receptacles which contain ferroelectric source materials; loading wafers into said processing tube; conveying vaporized gases from said receptacles to a mixing chamber using carrier gas when said processing is set to a predetermined temperature and mixing said vaporized gases in said mixing chamber, by keeping said processing tube vacuum; providing said mixing chamber with oxidization gas and reaction speed control gas to control reaction speed in said processing tube; and injecting mixed gases in said mixing chamber into said processing tube through a gas injecting means and depositing said mixed gases in said mixing chamber on the wafers.

11 Claims, 8 Drawing Sheets

D.T. : 500°C
A.T. : 650°C, 10 MINUTE, O₂

X div = 0.500
Y div = -9.0003
Offset = 0.689

FIG. 8B

| VOLTAGE(V) | ELECTRIC FIELD (KV/cm) | STORAGE CHANGE DENSITY($\mu$C/cm²) |
|---|---|---|
| 1.0 | 100 | 11.0 |
| 1.5 | 150 | 20.5 |
| 2.0 | 200 | 28.6 |
| 2.5 | 250 | 37.6 |

FIG. 9A

D.T. : 500°C
A.T. : 650°C, 10 MINUTE, O₂

X div = 1.000
Y div = -11.0715
Offset = 6.660

FIG. 9B

| VOLTAGE(V) | ELECTRIC FIELD (KV/cm) | STORAGE CHANGE DENSITY($\mu C/cm^2$) |
|---|---|---|
| 1.5 | 83.3 | 13.2 |
| 3.0 | 167 | 26.7 |
| 4.0 | 222 | 32.6 |
| 5.0 | 278 | 37.7 |

HOT-WALL CVD METHOD FOR FORMING A FERROELECTRIC FILM

This is a File Wrapper Continuation of application Ser. No. 08/476,734, filed Jun. 7, 1995, now abandoned.

BACKGROUND OF THE INVENTION

1. Field of the Invention

The present invention relates to a method for forming a ferroelectric film, and more particularly relates to a method for forming a ferroelectric film using the Hot-Wall chemical vapor deposition technique.

2. Description of the Prior Art

In general, ferroelectric films, such as PLT,PT,PZT,PLZT, and BST, are used for storing charges in DRAM, or non-volatile memory devices. Otherwise they're used as a thin film for detecting infrared rays, light memories, light switches, light modulator, and displayers.

A conventional method for forming a ferroelectric film uses the Sol-Gel coating method and the PVD(Physical Vapor Deposition) method using sputtering or Laser Ablation, etc..

The Sol-Gel coating method mixes acetate radical compounds or alkyl radical compounds containing metal, which is a precursor (source materials), and forms a thin film on a substrate which is spinning.

However, in the Sol-Gel coating method, there is a problem in that cracks are generated at the time of high temperature annealing for crystallization of the thin film, so that electrical and physical features of the thin film are degraded.

Also, the PVD method separates atoms from bulk materials which are matched with compositions of desired thin films using plasma, ion beam or laser, and deposits the atoms on a substrate.

However, in the PVD method, there is a problem in that the step-coverage of the thin films and electric features are poor and it costs a great deal of money in mass production.

SUMMARY OF THE INVENTION

An object of the present invention is to provide a method for forming a ferroelectric film having excellent step-coverage, electrical and physical features, and a facile composition control without external factors.

To achieve the above objection, the present invention provides a method for forming ferroelectric films using a hot-wall chemical vapor deposition apparatus, comprising the steps of: heating the processing tube and a plurality of receptacles, which contain ferroelectric source materials; loading wafers into said processing tube; conveying vaporized gases from said receptacles to a mixing chamber using carrier gas when said processing tube is set to a predetermined temperature and mixing said vaporized gases in said mixing chamber, by keeping said processing tube vacuum; providing said mixing chamber with oxidization gas and reaction speed control gas to control reaction speed in said processing tube; and injecting mixed gases in said mixing chamber into said processing tube through a gas injecting means and depositing said mixed gases in said mixing chamber on the wafers.

BRIEF DESCRIPTION OF THE DRAWINGS

The above and other objects, features and advantages of the present invention will be clearly understood from the following detailed description taken in conjunction with the accompanying diagrams, in which.

DETAILED DESCRIPTION OF THE INVENTION

Hereinafter, the present invention will be described referring to the drawings.

Figure 1:
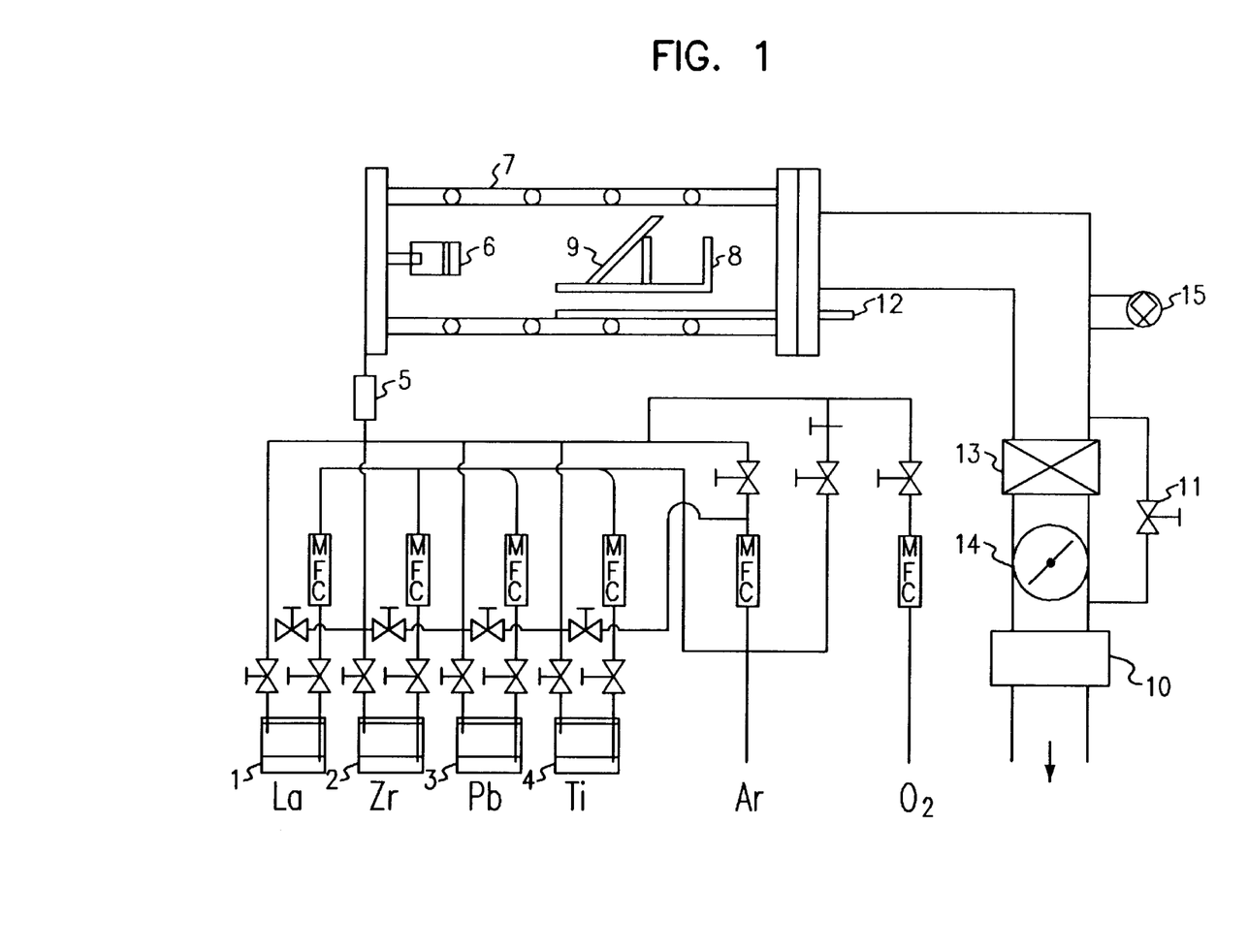
FIG. 1 is a schematic view showing a Chemical Vapor Deposition apparatus, in accordance with the present invention.

First, a method for forming a ferroelectric film, in accordance with the present invention is to form films using the CVD(Chemical Vapor Deposition) technique. FIG. 1 is a schematic view showing a Chemical Vapor Deposition apparatus, in accordance with the present invention.

As shown in FIG. 1, there are receptacles 1,2,3 and 4, which vaporize source materials for forming ferroelectric films, in each of which there is contained appropriate source materials, in accordance with desired dielectric films.

Source gas pipelines, leading vaporized gases from source materials, and carrier gas pipelines, leading carrier gas, in addition to other gas pipelines used in the process for forming ferroelectric films are heated by a heater, so that these gas pipelines are controlled by a mass flow controller. Source gases, which flow in these gas pipelines, are conveyed by carrier gas, such as Ar, $O_2$. The Chemical Vapor Deposition apparatus, in accordance with the present invention, has a mixing chamber 5 in order for each of the source gases, such as La, Zr, Pb, and Ti, which are conveyed by the carrier gas, to be mixed in the mixing chamber 5.

Mixed gases, which are mixed in the mixing chamber 5, are injected into a processing tube 7 through a gas injector 6 in the processing tube 7, and formed into ferroelectric films on a substrate, which is mounted on a quartz boat 8.

Of course, the Chemical Vapor Deposition apparatus, in accordance with the present invention, has the same main gate valve 13 and threshold valve 14 as a conventional Chemical Vapor Deposition apparatus. Also, a pump 10 is connected to the processing tube 7 in order for the pump 10 to pump the processing tube 7 through the main gate valve 13 and the threshold valve 14, by controlling a half gate valve 11, and a thermocouple 12 and a pressure gauge 15 are comprised to measure temperature and pressure in the processing tube 7.

The processing tube 7 and the substrate 9, in accordance with the present invention, are heated by a heater(not shown in FIG. 1) positioned outside the processing tube 7.

Next, a method for forming ferroelectric films using the above apparatus will be described referring to FIG. 1.

All the gas pipelines between the receptacles 1,2,3 and 4, and the processing tube 7 are heated by heating wires and heating boxes, thereby the temperature of all the gas pipelines is 20° C. higher than vaporization temperature. Then, gases vaporized from ferroelectric source materials, such as La, Zr, Pb, and Ti, are conveyed by carrier gas and uniformly mixed in the mixing chamber 5.

Mixed gases mixed in the mixing chamber 5 are injected into the processing tube 7 through the gas injector 6 and formed into ferroelectric films on the substrate 9.

Furthermore, all the gas pipelines and the processing tube 7 are heated after temperature of the receptacles 1,2,3 and 4 are 20° C. higher than vaporization temperature.

Next, the gas valve connected to a carrier gas source is opened and argon or nitrogen gas is lead into all the gas pipelines, and the processing tube 7 for 30 to 60 minutes for purging, and the substrate 9 is inserted into the processing tube 7 after the processing tube 7 is back-filled with room pressure.

Sequentially, a half gate valve 11 is opened, in order that the pressure of the processing tube 7 is kept less than 500 mT, and a main gate valve 13 is opened, in order that the pressure of the processing tube 7 is kept less than 50 mT, and the processing tube 7 is heated, until setting temperature of the substrate 9 is 400° C. to 700° C., by injecting argon or nitrogen gas into the processing tube 7.

When the reacting chamber reaches the predetermined setting temperature, the injection of argon or nitrogen gas is stopped, and the carrier gas is introduced. This carrier gas conveys vaporized source gases so that they are injected into the processing tube 7 through the gas injector 6 to form ferroelectric films such as PLT,PZT,PLZT.

Although the gas injector 6 is positioned in the processing tube 7, the gas injector 6 is heated independently of the processing tube 7, thereby being maintained at a temperature of 200° C. to 300° C.

Also, the mixing chamber 5 is connected to an oxygen gas (or ozone gas) pipeline which introduces oxygen gas for oxidizing vaporized source gases. Uniform film features may be obtained by controlling the amount of carrier gas, argon or nitrogen gas, which controls the speed of the deposition of the ferroelectric films.

After the temperature of the processing tube 7 is set, the degree of vacuum of the processing tube 7 in which the ferroelectric films are formed is maintained at a pressure of 100 mT to 1200 mT. When the desired deposition time is achieved, the valves of all the gas pipelines are closed to stop injection of all the gases. After the temperature of the processing tube 7 is lowered, the processing tube 7 and all the gas pipelines are purged by argon or nitrogen gas and the substrate 9 is taken out from the processing tube 7.

Furthermore, ferroelectric films having excellent electrical features may be obtained by annealing in the oxygen atmosphere.

Figure 2:
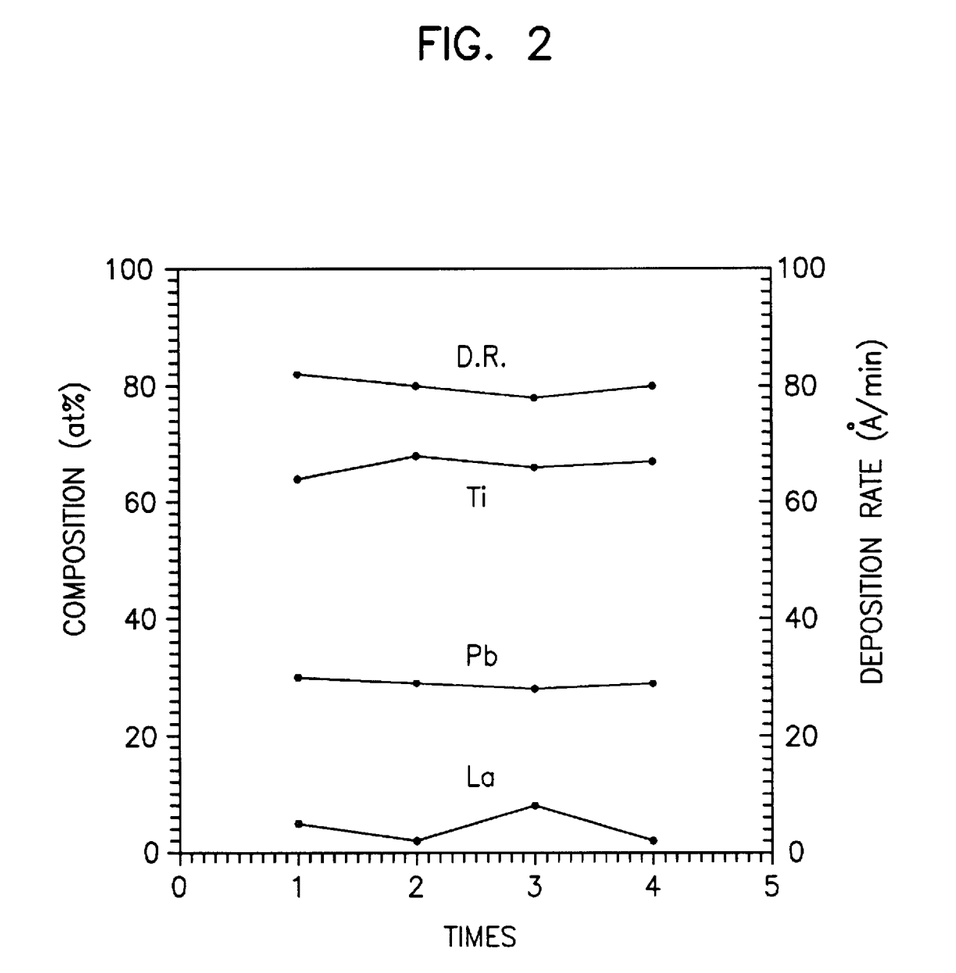
FIG. 2 is a plot showing deposition rate according to various conditions for illustrating reappearance of PLT dielectric film, in accordance with the present invention.

FIG. 2 is a plot showing the deposition rate, according to various conditions, for illustrating reappearance of PLT dielectric films, in accordance with the present invention, where, receptacle 1: $Pb(dpm)_2$, 155° C., 60 sccm
receptacle 2: $La(dpm)_3$, 195° C., 20 sccm
receptacle 3: Titanium Tetraisopropoxide($Ti(C_3H_7O)_4$), 45° C., 100 sccm
carrier gas: argon gas, 400 sccm
oxygen gas: 500 sccm
thickness: 50 nm to 500 nm As shown in FIG. 2, the variation of the deposition rate (at %) of ferroelectric films, which are formed four times, is very small. That is to say, FIG. 2 is showing that the reappearance of PLT dielectric films, in accordance with the present invention, is excellent.

Figure 3:
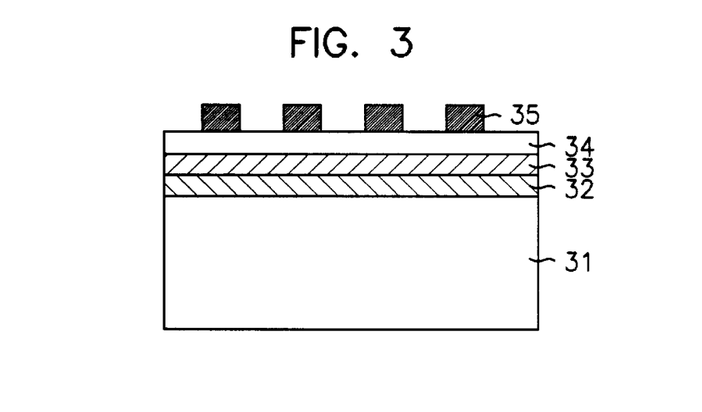
FIG. 3 is a cross-sectional view showing a structure of a capacitor for measuring electric features of PLT dielectric film, in accordance with the present invention.

FIG. 3 is a cross-sectional view showing a structure of a capacitor for measuring the electrical features of the PLT dielectric films, in accordance with the present invention. The reference numeral 31 denotes Si substrate, 32 denotes $SiO_2$ film, 33 and 35 denote Pt electrode, and 34 denotes ferroelectric films.

FIGS. 4 through 9 show the features of the ferroelectric films in accordance with the present invention.

The Ferroelectric films in FIGS. 4 to 9 are deposited to a thickness of 100 nm, and annealed in the oxygen atmosphere for 10 minutes at 650° C. The composition rate of Pb, La, and Ti is 46, 3 and 51%, respectively.

Figure 4:
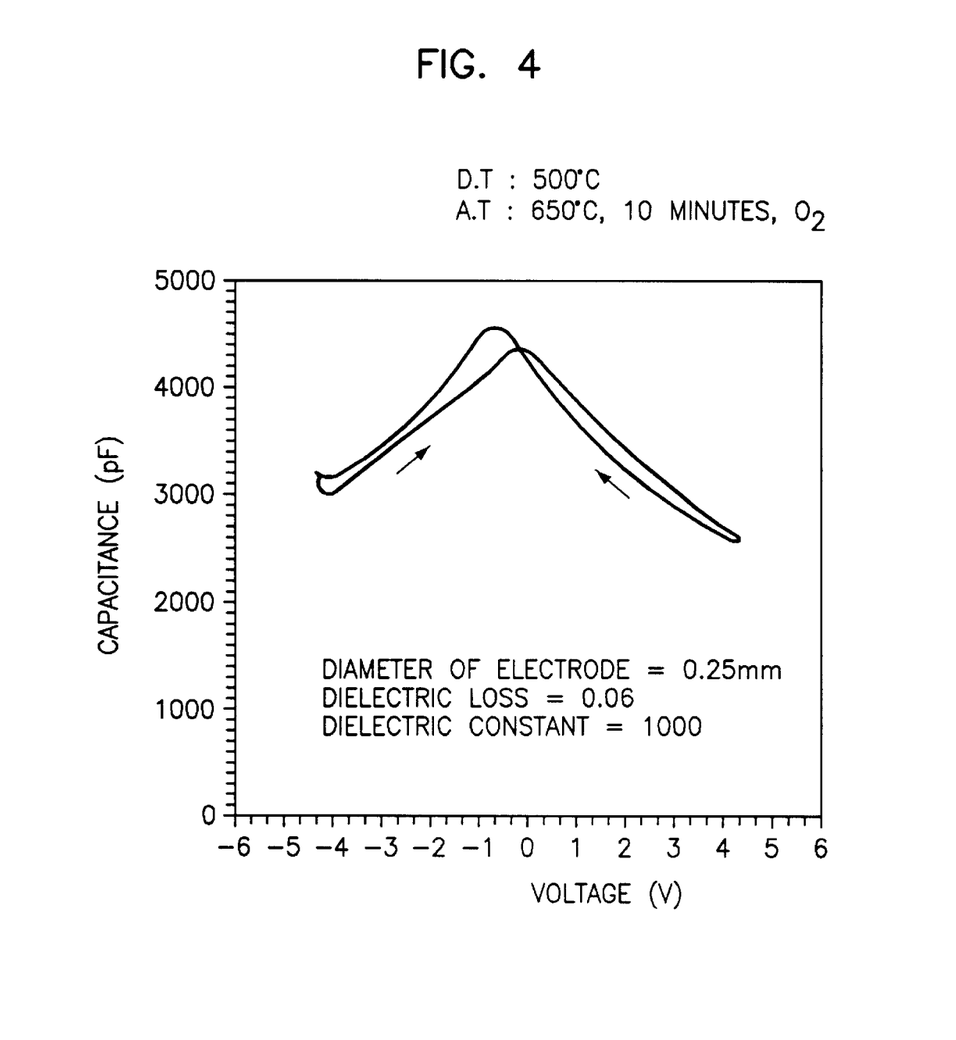
FIG. 4 is a plot showing capacitance to voltage of the capacitor having the structure in FIG. 3 where the capacitor consists of dielectric films formed to a thickness of 100 nm.

FIG. 4 is a view showing C-V characteristics of ferroelectric films formed to a thickness of 100 nm, which are showing a hysteresis loop by means of ferroelectric. As shown in FIG. 4, at 100 KHz, a dielectric constant is 800 to 1000, and a dielectric loss is 0.06.

Figure 5:
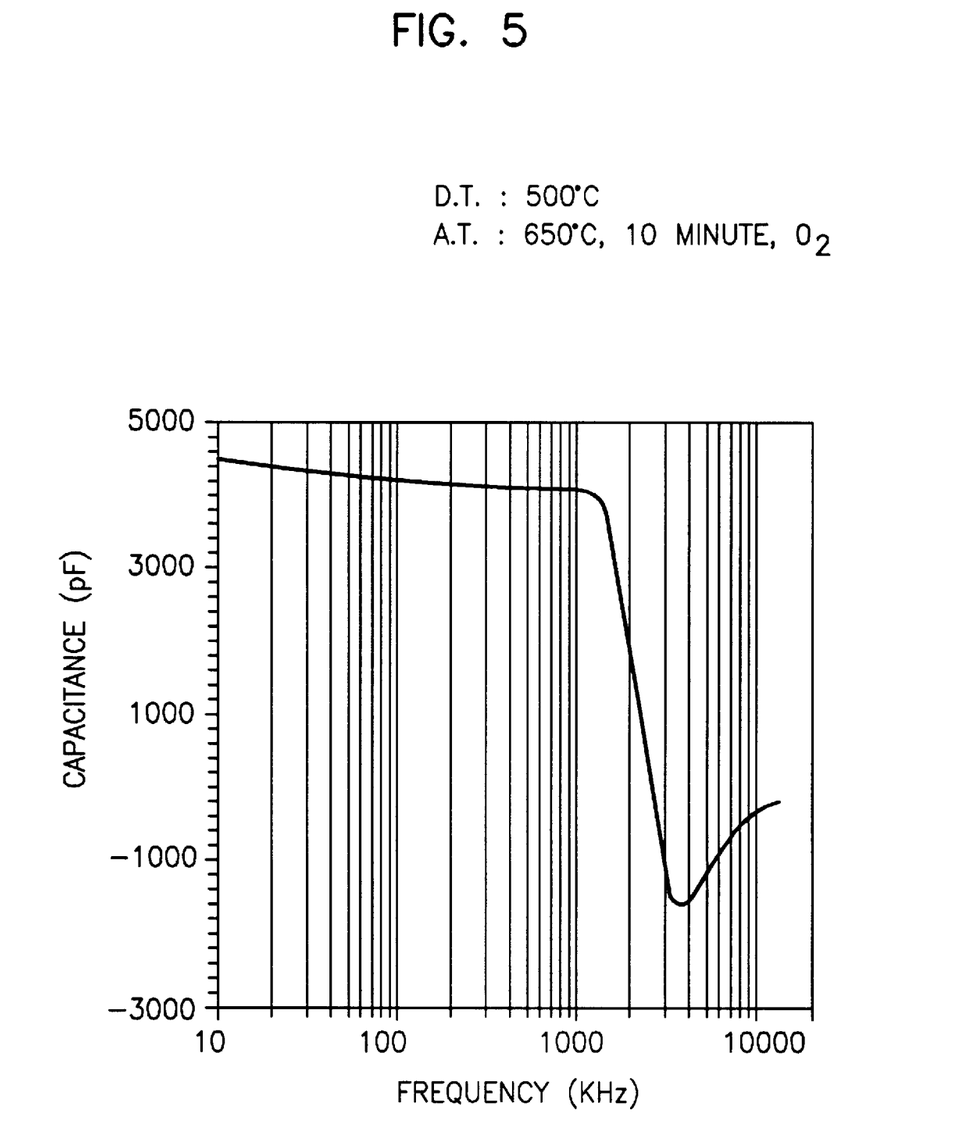
FIG. 5 is a plot showing capacitance to frequency of the capacitor having the structure in FIG. 3 where the capacitor consists of dielectric films formed to a thickness of 100 nm.

FIG. 5 is a view showing C-F characteristics of ferroelectric films formed to a thickness of 100 nm, which are showing that a dielectric dispersion is small according to increasing frequency. Also, the reduction of capacitance at 3 MHz is caused by resonance of the measuring line.

Figure 6:
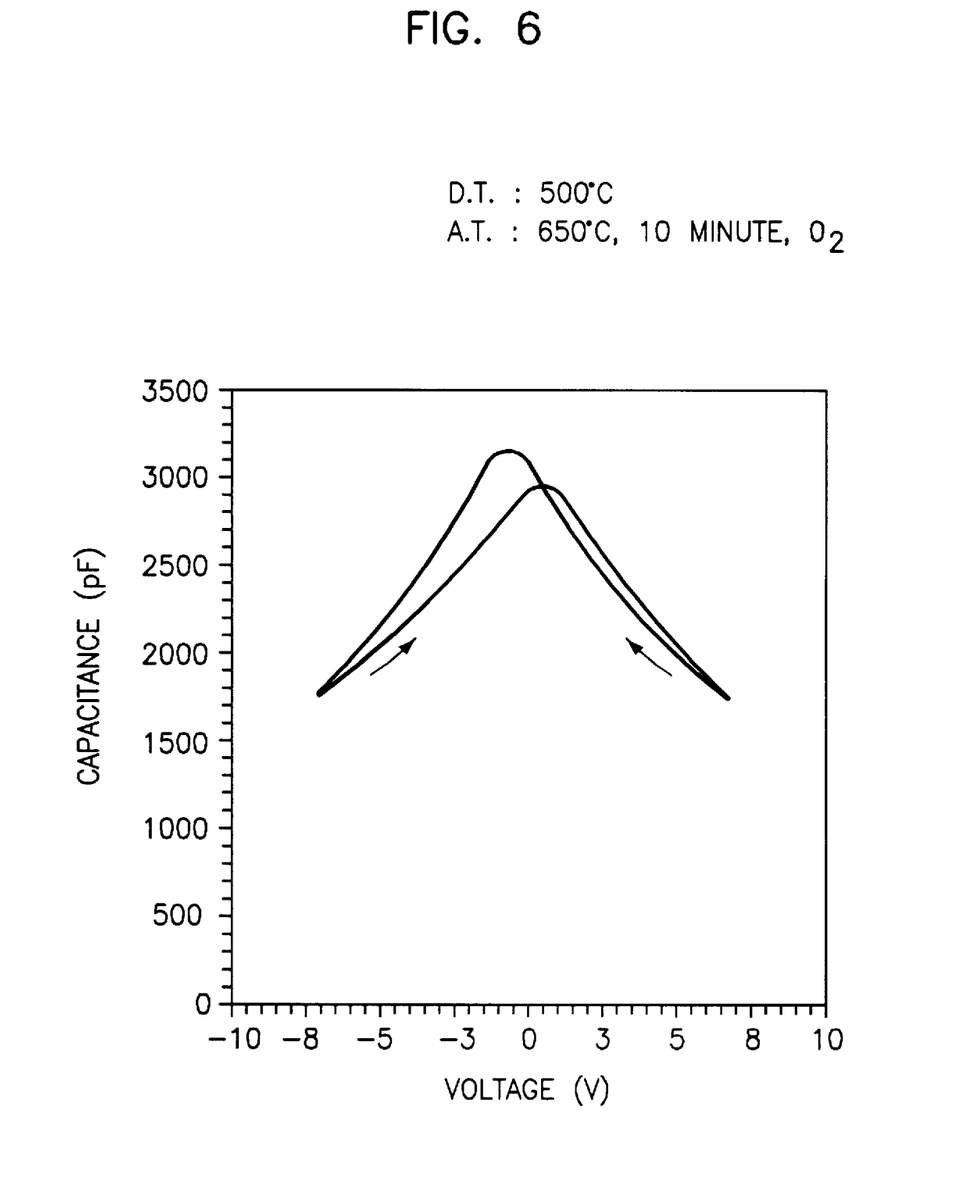
FIG. 6 is a plot showing capacitance to voltage of the capacitor having the structure in FIG. 3 where the capacitor consists of dielectric films formed to a thickness of 200 nm.

FIG. 6 is a view showing C-V characteristics of ferroelectric films formed to a thickness of 200 nm, which are showing a hysteresis loop by means of ferroelectric. As shown in FIG. 4, at 100 KHz, a dielectric constant is 1000 to 2000, and a dielectric loss is 0.06.

Figure 7:
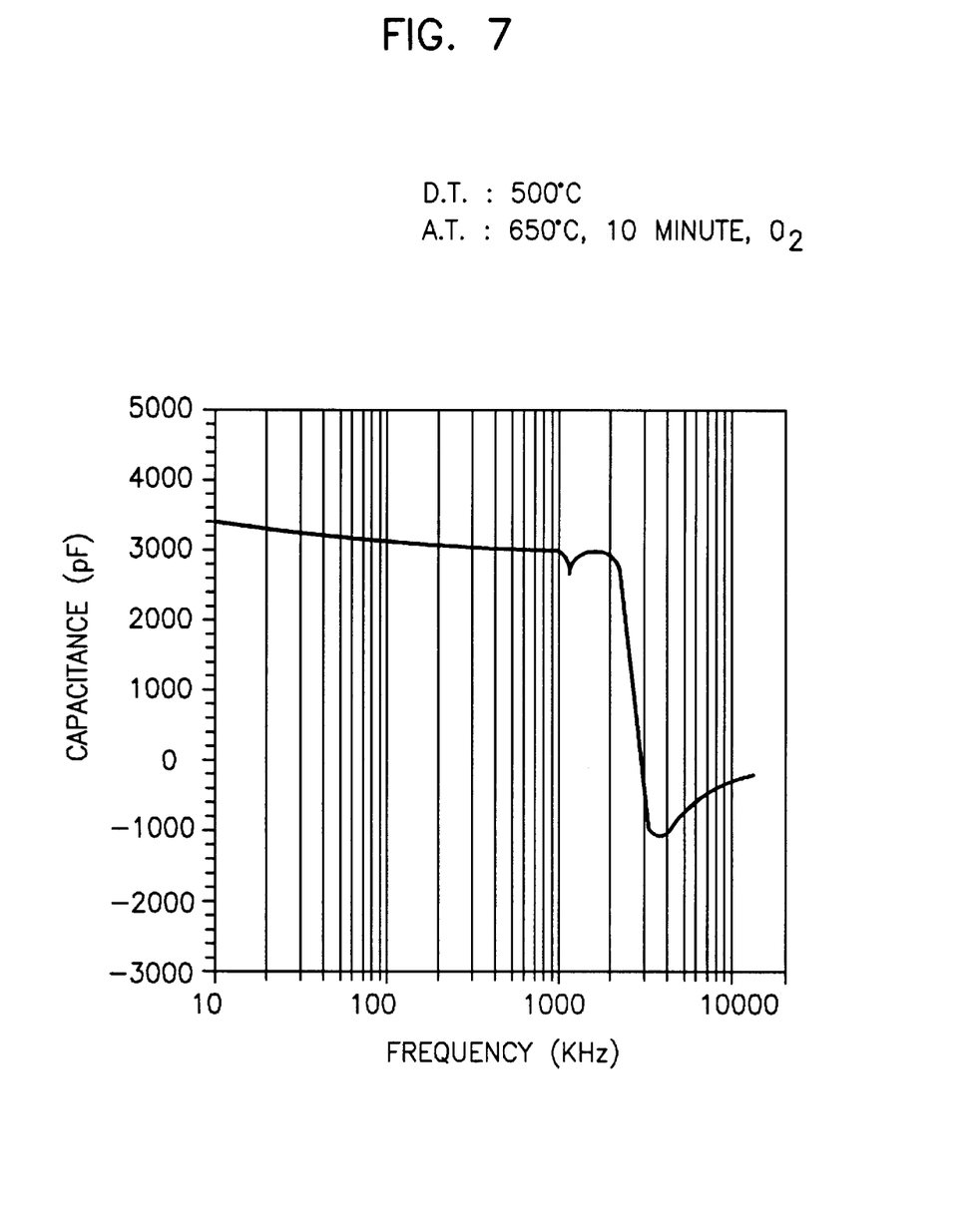
FIG. 7 is a plot showing capacitance to frequency of the capacitor having the structure in FIG. 3 where the capacitor consists of dielectric films formed to a thickness of 200 nm.

FIG. 7 is a view showing C-F characteristics of ferroelectric films formed to a thickness of 200 nm, which are showing the same as characteristics as in FIG. 4.

Figure 8A:
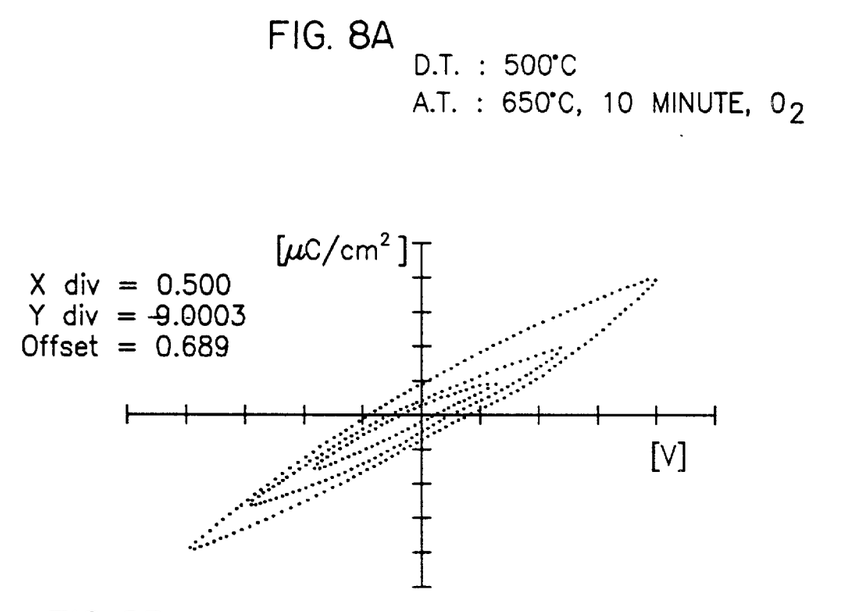
FIG. 8 is a hysteresis loop showing polarization to voltage of the capacitor having the structure in FIG. 3 where the capacitor consists of dielectric films formed to a thickness of 100 nm.
Figure 8B:
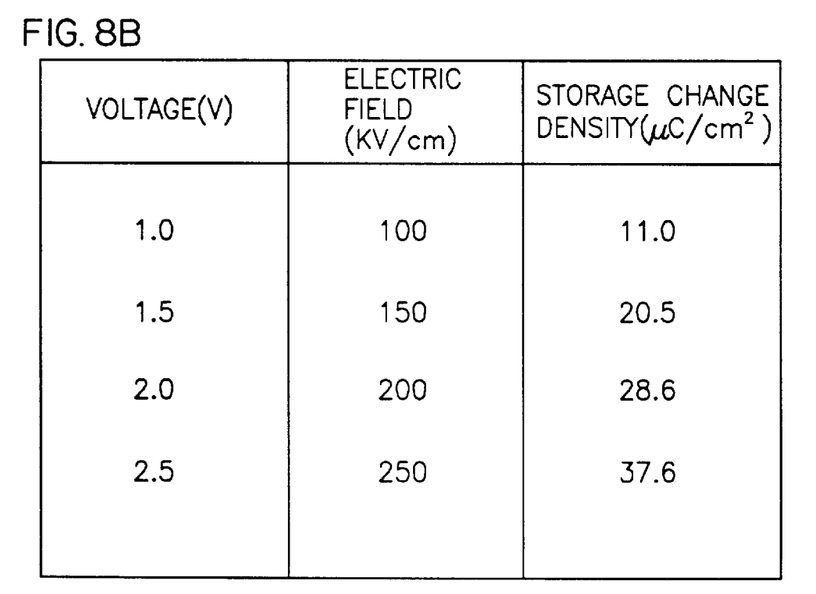

FIG. 8 is a view showing polarization characteristics of ferroelectric films formed to a thickness of 100 nm, which are showing a slim hysteresis loop by means of ferroelectric. As shown in FIG. 8, the effective storage charge density, which can be used in DRAM, is 28.6 $\mu C/cm^2$ at operation voltage 2V (electric field is 200 KV/cm). When the effective storage charge density is converted into a capacitance, the capacitance is 143 $fF/\mu m^2$. Also, when the ferroelectric film is converted into a $SiO_2$ film, the thickness of the $SiO_2$ film is 2.3 Å.

Figure 9A:
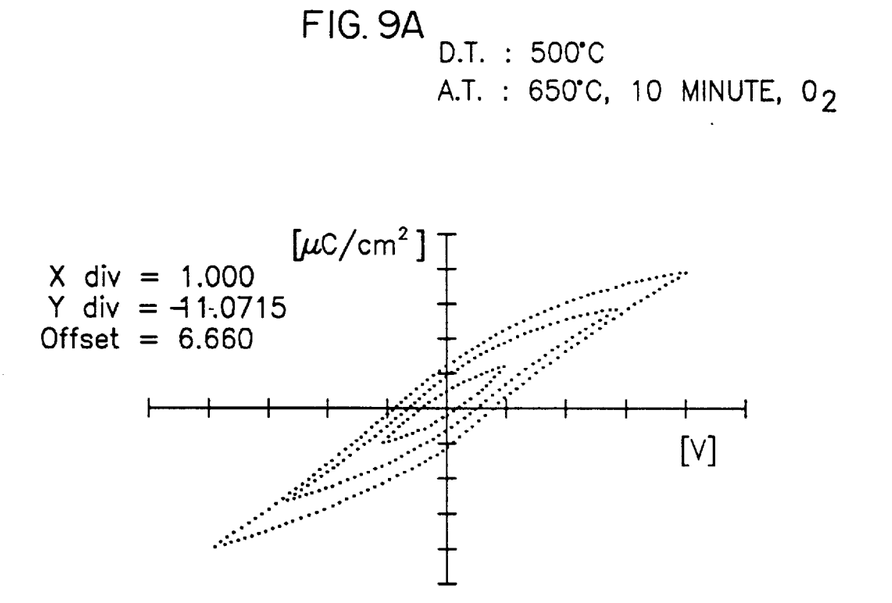
FIG. 9 is a hysteresis loop showing polarization to voltage of the capacitor having the structure in FIG. 3 where the capacitor consists of dielectric films formed to a thickness of 200 nm.
Figure 9B:
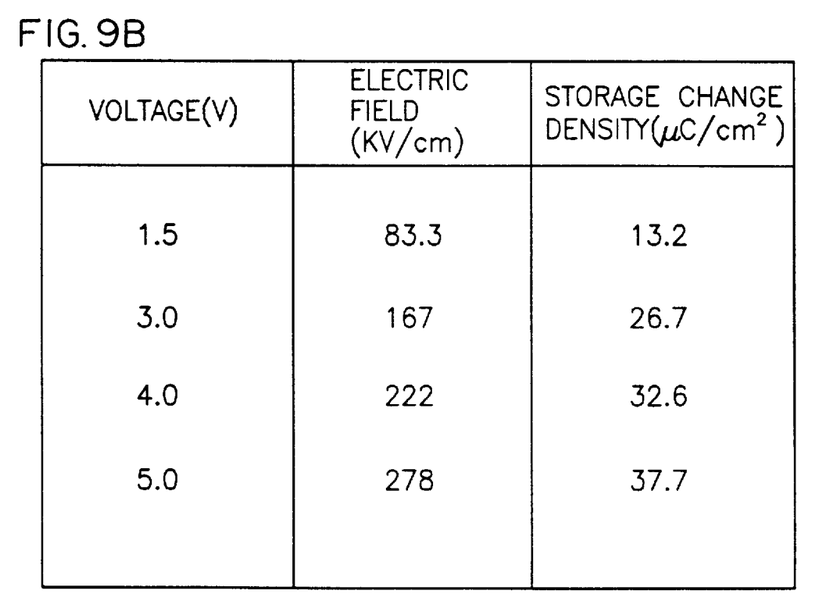

FIG. 9 is a view showing the polarization characteristics of ferroelectric films formed to a thickness of 200 nm. As shown in FIG. 8, the effective storage charge density, which can be used in DRAM, is 26.7 $\mu C/cm^2$ at operation voltage 3V (electric field is 167 KV/cm). When the effective storage charge density is converted into a capacitance, the capacitance is 143 $fF/\mu m^2$. Also, when the ferroelectric film is converted into a $SiO_2$ film, the thickness of the $SiO_2$ film is 2.3 Å.

As stated above, the present invention provides a method for forming ferroelectric film having excellent step-coverage, electrical and physical features and facile composition control without external factors. Accordingly, the present invention has an effect of improving the dielectric feature in a semiconductor device and forming ferroelectric films with a batch-type which can process many wafers at once.

Although the preferred embodiments of the invention have been disclosed for illustrative purposes, those skilled in the art will appreciate that various modifications, additions and substitutions are possible, without deporting from the scope and spirit of the invention as disclosed in the accompanying claims.

What is claimed is:

1. A method for forming ferroelectric films using a hot-wall chemical vapor deposition apparatus, comprising the steps of:

heating a processing tube and a plurality of receptacles which contain ferroelectric source materials and loading wafers into said processing tube;

conveying vaporized gases from said receptacles to a mixing chamber using a carrier gas when said processing tube is set to a predetermined temperature and mixing said vaporized gases in said mixing chamber, keeping said processing tube at vacuum;

providing said mixing chamber with an oxidization gas and a reaction speed control gas to control reaction speed in said processing tube; and injecting mixed gases in said mixing chamber into said processing tube through a gas injector positioned in said processing tube and depositing said mixed gases on the wafers;

wherein said gas injector is heated independent of said processing tube and a temperature of said gas injector is less than that of said processing tube;

wherein the step of depositing said mixed gases on the wafers is carried out at a pressure of approximately 100 mTorr to 1200 mTorr.

2. A method for forming a ferroelectric film in accordance with claim 1, wherein the step of depositing said mixed gases on the wafers further comprises the step of annealing said wafers on which said mixed gases are deposited.

3. A method for forming a ferroelectric film in accordance with claim 1, wherein the step of heating said processing tube further comprises the step of purging said processing tube and all the gas pipelines which are connected to said processing tube.

4. A method for forming a ferroelectric film in accordance with claim 1, wherein the degree of vacuum of said processing tube is kept at less than approximately 50 mT when said vaporized gases are mixed in said mixing chamber.

5. A method for forming a ferroelectric film in accordance with claim 1, wherein said reaction speed control gas is argon gas.

6. A method for forming a ferroelectric film in accordance with claim 1, wherein said oxidization gas is oxygen gas or ozone gas.

7. A method for forming a ferroelectric film in accordance with claim 1, wherein the temperature of said processing tube is approximately 400° C. to 700° C.

8. A method for forming a ferroelectric film in accordance with claim 1, wherein said gas injector is maintained at a temperature of approximately 200° C. to 300° C.

9. A method for forming a ferroelectric film in accordance with claim 1, wherein said hot-wall chemical vapor deposition apparatus is a batch-type.

10. A method for forming a ferroelectric film in accordance with claim 1, wherein the temperature of gas pipelines between the receptacles and said processing tube is approximately 20° C. higher than the vapor temperature for vaporizing said ferroelectric source materials.

11. A method for forming a ferroelectric film in accordance with claim 3, wherein gas to purge said processing tube and all the gas pipelines, which are connected to said processing tube, is argon gas or nitrogen gas.

* * * * *